(12) United States Patent
Phillips

(10) Patent No.: US 6,929,048 B2
(45) Date of Patent: Aug. 16, 2005

(54) LASER TRANSFER OF ORGANIC MATERIAL FROM A DONOR TO FORM A LAYER IN AN OLED DEVICE

(75) Inventor: Bradley A. Phillips, Honeoye Falls, NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 10/656,621

(22) Filed: Sep. 5, 2003

(65) Prior Publication Data

US 2005/0051277 A1  Mar. 10, 2005

(51) Int. Cl.[7] .......................... B32B 31/28; B32B 31/20
(52) U.S. Cl. ............... 156/540; 156/379.6; 156/379.8; 156/382; 156/580; 427/457; 427/510; 430/200; 430/201; 346/105; 347/217
(58) Field of Search ............................ 156/230–234, 156/240, 247, 272.2, 285, 379.6, 379.8, 381, 380.5, 382, 540, 580, 581, 583; 118/50, 50.1; 427/96, 146, 147, 148, 457, 472, 492, 510; 428/195, 202, 914; 430/7, 30, 200, 201, 321; 347/217; 346/76.1, 105, 134

(56) References Cited

U.S. PATENT DOCUMENTS

| | | | |
|---|---|---|---|
| 5,688,551 | A | 11/1997 | Littman et al. |
| 5,742,129 | A | 4/1998 | Nagayama et al. |
| 5,851,709 | A | 12/1998 | Grande et al. |
| 5,937,272 | A | 8/1999 | Tang |
| 6,114,088 | A | 9/2000 | Wolk et al. |
| 6,140,009 | A | 10/2000 | Wolk et al. |
| 6,214,520 | B1 | 4/2001 | Wolk et al. |
| 6,221,553 | B1 | 4/2001 | Wolk et al. |
| 6,695,029 | B2 * | 2/2004 | Phillips et al. ............... 156/540 |
| 6,695,030 | B1 * | 2/2004 | Phillips et al. ............... 156/540 |

FOREIGN PATENT DOCUMENTS

EP  1028 001 A1  7/1997

* cited by examiner

Primary Examiner—Sue A. Purvis
(74) Attorney, Agent, or Firm—Raymond L. Owens

(57) ABSTRACT

Apparatus for permitting the laser transfer of organic material from a donor onto a substrate to form a layer of organic material on one or more OLED devices, wherein the donor includes a laser light-absorbing layer, and a layer with heat transferable organic material.

9 Claims, 8 Drawing Sheets

LASER TRANSFER OF ORGANIC MATERIAL FROM A DONOR TO FORM A LAYER IN AN OLED DEVICE

CROSS REFERENCE TO RELATED APPLICATION

Reference is made to commonly assigned U.S. patent application Ser. No. 10/021,410 filed Dec. 12, 2001, entitled "Apparatus for Permitting Transfer of Organic Material From a Donor to Form a Layer in an OLED Device" by Bradley A. Phillips et al.; the disclosure of which is incorporated herein by reference.

FIELD OF THE INVENTION

The present invention relates to organic electroluminescent (EL) devices, also known as organic light-emitting diodes (OLEDs), and particularly to an apparatus, which facilitates forming organic layers in such devices.

BACKGROUND OF THE INVENTION

In color or full-color organic electroluminescent (EL) displays having an array of colored pixels such as red, green, and blue color pixels (commonly referred to as RGB pixels), precision patterning of the color-producing organic EL media is required to produce the RGB pixels. The basic EL device has in common an anode, a cathode, and an organic EL medium sandwiched between the anode and the cathode. The organic EL medium can include one or more layers of organic thin films, where one of the layers or regions within a layer is primarily responsible for light generation or electroluminescence. This particular layer is generally referred to as the light-emitting layer of the organic EL medium. Other organic layers present in the organic EL medium commonly facilitate electronic transportation, and are referred to as either the hole-transporting layer (for hole conduction) or electron-transporting layer (for electron conduction). In forming the RGB pixels in a full-color organic EL display panel, it is necessary to devise a method to precisely pattern the emissive layer of the organic EL medium or the entire organic EL medium.

Typically, electroluminescent pixels are formed on the display by shadow masking techniques, such as shown in U.S. Pat. No. 5,742,129. Although this has been effective, it has several drawbacks. It has been difficult to achieve high resolution of pixel sizes using shadow masking. Moreover, there are problems of alignment between the substrate and the shadow mask, and care must be taken that pixels are formed in the appropriate locations. When it is desirable to increase the substrate size, it is difficult to manipulate the shadow mask to form appropriately positioned pixels. A further disadvantage of the shadow mask method is that the mask holes can become plugged with time. Plugged holes on the mask lead to the undesirable result of non-functioning pixels on the EL display.

There are further problems with the shadow mask method, which become especially apparent when making EL devices with dimensions of more than a few inches on a side. It is extremely difficult to manufacture larger shadow masks with the required precision (hole position of ±5 micrometers) for accurately forming EL devices.

A method for patterning high-resolution organic EL displays has been disclosed in U.S. Pat. No. 5,851,709 by Grande et al. This method is comprised of the following sequences of steps: 1) providing a donor substrate having opposing first and second surfaces; 2) forming a light-transmissive, heat-insulating layer over the first surface of the donor substrate; 3) forming a light-absorbing layer over the heat-insulating layer; 4) providing the donor substrate with an array of openings extending from the second surface to the heat-insulating layer; 5) providing a transferable, color-forming, organic donor layer formed on the light-absorbing layer; 6) precision aligning the donor substrate with the display substrate in an oriented relationship between the openings in the substrate and the corresponding color pixels on the device; and 7) employing a source of radiation for producing sufficient heat at the light-absorbing layer over the openings to cause the transfer of the organic layer on the donor substrate to the display substrate. A problem with the Grande et al. approach is that patterning of an array of openings on the donor substrate is required. This creates many of the same problems as the shadow mask method, including the requirement for precision mechanical alignment between the donor substrate and the display substrate. A further problem is that the donor pattern is fixed and cannot be changed readily.

Using an unpatterned donor sheet and a precision light source, such as a laser, can remove some of the difficulties seen with a patterned donor. Such a method is disclosed by Littman et al. in U.S. Pat. No. 5,688,551, and in a series of patents by Wolk et al. (U.S. Pat. Nos. 6,114,088; 6,140,009; 6,214,520; and 6,221,553).

In commonly assigned U.S. Pat. No. 5,937,272, Tang has taught a method of patterning multicolor pixels (e.g. red, green, and blue subpixels) onto a thin-film-transistor (TFT) array substrate by vapor deposition of an EL material. Such EL material can be precoated on one surface of a donor support material and transferred to a substrate by vapor deposition in a selected pattern (as in FIGS. 4, 5, and 6 in the aforementioned U.S. Pat. No. 5,937,272).

The EL material transfer is preferably done in a vacuum chamber such as Tang describes in the aforementioned patent and, in particular, vacuum is preferably maintained between the donor and substrate. The donor and substrate must also be kept in close proximity during the EL transfer (less than 250 micrometers between the coating and raised portions of the substrate as taught by Tang). Furthermore, the donor can be in contact with the raised portions of the substrate and thereby maintain sufficient spacing between the coating and the recessed portions of the substrate where the EL material is deposited. In any case, a method of holding the donor and substrate in contact in a vacuum chamber while maintaining vacuum between the donor and substrate is required.

Isberg et al., in commonly assigned European Patent Application 1 028 001 A1, have disclosed the additional use of an adhesion-promoting layer between the donor layer and substrate. While this would help promote the close contact required by Tang, it would be disadvantageous because the adhesion-promoting layer can introduce impurities in the form of the adhesive.

Mechanical pressure, such as that applied by a manual plate, can be used but is difficult to maintain evenly over the entire surface for the micrometer-order tolerances needed. Pressure from air or other fluids would work better, but the use of such pressure is made difficult in that the conditions in the vacuum chamber need to remain undisturbed.

SUMMARY OF THE INVENTION

It is therefore an object of the present invention to provide a more effective way of positioning a donor to an OLED substrate for facilitating the formation of one or more layers of organic material.

This object is achieved by apparatus for permitting the transfer of organic material from a donor onto a substrate to form a layer of organic material on one or more OLED devices, wherein the donor includes a laser light-absorbing layer, and a layer with heat transferable organic material, comprising:

a) means for providing a movable laser for producing a beam of light and at least one lens for focusing such light beam at a position corresponding to the laser light-absorbing layer in the donor;
 b) a first fixture arranged to support the donor and substrate in a relationship relative to one another whereby there will be either a separation between portions of the substrate and the donor, or the substrate and donor will be in contact, and wherein organic material will be transferred onto portions of the substrate;
 c) a second fixture including a pressure plate aligned with and engaging the first fixture, the donor being supported on the pressure plate and the pressure plate being movable to clamp the donor and substrate to the first fixture and forming a chamber relative to a non-transfer surface of the donor;
 d) means for supplying a fluid to the chamber to apply pressure to the non-transfer surface of the donor so as to ensure the position of the donor relative to the substrate;
 e) the first fixture including a transparent portion located in relationship to the non-transfer surface of the donor to permit transmission of the laser light beam through such transparent portion to the non-transfer surface of the donor; and
 f) means for maintaining the spacing of the laser relative to the donor so that the laser light-absorbing layer is within the focal plane of the laser light beam to within ±35 microns, the laser being positioned so that the laser light is focused on the laser light-absorbing layer as the laser light beam moves across the donor to permit heat to be absorbed which causes the transfer of organic material to the substrate.

Advantages

An advantage to this method is that it maintains a radiation-absorbing layer of a donor material within the focal plane of a laser over the entire transfer surface area of the donor. A further advantage to this method is that it provides for maintaining a uniform spacing between a donor and a substrate in an ambient vacuum or vacuum environment where the vacuum is maintained between the donor and substrate. This method provides suitable clamping in an environment (vacuum) that is advantageous for lowering contamination. A further advantage is that this method can be fully automated including donor and substrate media handling. The present invention is particularly suitable for forming organic layers over a large area having a number of OLED display devices, which are in the process of being formed, thereby increasing throughput.

Figure 1:
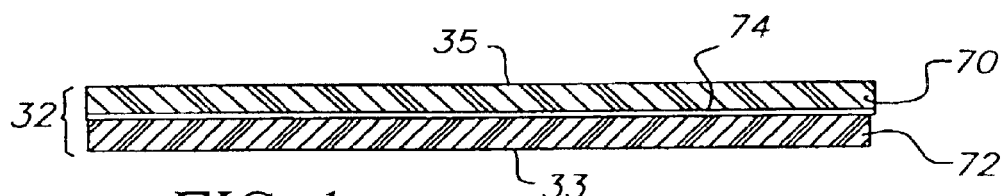
FIG. 1 shows a cross-sectional representation of one embodiment of the structure of a donor that can be used in the apparatus described herein.

Since device feature dimensions such as layer thicknesses are frequently in sub-micrometer ranges, the drawings are scaled for case of visualization rather than dimensional accuracy.

DETAILED DESCRIPTION OF THE INVENTION

The term "display" or "display panel" is employed to designate a screen capable of electronically displaying video images or text. The term "pixel" is employed in its art-recognized usage to designate an area of a display panel that can be stimulated to emit light independently of other areas. The term "multicolor" is employed to describe a display panel that is capable of emitting light of a different hue in different areas. In particular, it is employed to describe a display panel that is capable of displaying images of different colors. These areas are not necessarily contiguous. The term "full-color" is employed to describe multicolor display panels that are capable of emitting in the red, green, and blue regions of the visible spectrum and displaying images in any combination of hues. The red, green, and blue colors constitute the three primary colors from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixel.

The term "subpixel" is used in multicolor display panels and is employed to designate any portion of a pixel that can be independently addressable to emit a specific color. For example, a blue subpixel is that portion of a pixel that can be addressed to emit blue light. In a full-color display, a pixel generally comprises three primary color subpixels, namely blue, green, and red. The term "pitch" is used to designate the distance separating two pixels or subpixels in a display panel. Thus, a subpixel pitch means the separation between two subpixels. The term "vacuum" is used herein to designate a pressure of 1 Torr or less.

Phillips et al., in commonly assigned U.S. patent application Ser. No. 10/021,410 filed Dec. 12, 2001, entitled "Apparatus for Permitting Transfer of Organic Material From a Donor to Form a Layer in an OLED Device", the disclosure of which is incorporated herein by reference, have described an apparatus for positioning a donor to an OLED substrate for facilitating the formation of one or more layers of organic material. Such an apparatus works well with flash-lamp-type irradiation. However, the use of a laser as a method of irradiation requires that the radiation-absorbing layer of the donor be held in tight tolerance, for example ±35 microns, such that it is positioned within the focal plane of the laser during the organic material transfer process. Stresses due to external and internal pressure differences and the pressure required to clamp the pressure plate during the organic material transfer process can cause flexing of the surfaces that position the radiation-absorbing layer such that a portion of the radiation-absorbing layer can fall outside of the focal plane of the laser. It is necessary to reduce such flexing to, for example, less than ±10 microns for each component that positions the radiation absorbing layer to maintain the spacing of the laser relative to the donor so that the total variability is less than ±35 microns at all points on the donor.

Turning now to FIG. 1, there is shown one embodiment of the structure of a donor 32 that can be used in the apparatus described herein. Donor 32 can be formed in a sheet or as a continuous roll. Donor 32 includes at the minimum a support 72 that is preferably flexible, which comprises non-transfer surface 33. Support 72 is first uniformly coated with laser light-absorbing layer 74 that includes a radiation-absorbing material capable of absorbing radiation in a predetermined portion of the spectrum to produce heat so as to cause the transfer of organic material, then coated with a layer of heat transferable organic material 70. Support 72 then comprises non-transfer surface 33 of donor 32 and organic material 70 comprises transfer surface 35 of donor 32. Laser light-absorbing layer 74 is capable of absorbing radiation in a predetermined portion of the spectrum thereby producing heat. The radiation-absorbing material can be a dye such as the dyes specified in U.S. Pat. No. 5,578,416, a pigment such as carbon, or a metal such as nickel, chromium, titanium, etc.

Support 72 can be made of any of several materials, which meet at least the following requirements. It must be capable of maintaining it's structural integrity during the organic material transfer step while it is pressurized on one side, and during any pre-treat heating steps contemplated to remove volatile constituents such as water vapor. Additionally, support 72 must be capable of receiving on one surface a relatively thin coating of organic material 70, and of retaining this coating without degradation during anticipated storage periods of the coated support (donor 32). Support materials meeting these requirements include, for example, metal foils, certain plastic foils which exhibit a glass transition temperature value higher than a support temperature value anticipated to cause transfer of the transferable organic material 70 coated on support 72, and fiber-reinforced plastic foils. While selection of suitable support materials can rely on known engineering approaches, it will be appreciated that certain aspects of a selected support material merit further consideration when configured as a donor support useful in the practice of the invention. For example, support 72 can require a multi-step cleaning and surface preparation process prior to precoating with laser light-absorbing layer 74 or organic material 70. If support 72 is a radiation-transmissive material, the incorporation into support 72 or onto a surface thereof, of a radiation-absorptive material can be advantageous to more effectively heat support 72 to provide a correspondingly enhanced transfer of transferable organic material 70 from support 72 to a substrate.

A typical OLED device can contain the following layers, usually in this sequence: an anode, a hole-injecting layer; a hole-transporting layer; a light-emitting layer; an electron-transporting layer; and a cathode. Organic material 70 can be a hole-injecting material, a hole-transporting material, an electron-transporting material, a light-emitting material, a host material, or a combination of any of these materials. These materials are described below.

Hole-Injecting (HI) Material

While not always necessary, it is often useful that a hole-injecting layer be provided in an organic light-emitting display. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1 029 909 A1.

Hole-Transporting (HT) Material

Hole-transporting materials useful as organic material 70 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen containing group are disclosed by Brantly et al. in commonly assigned U.S. Pat. Nos. 3,567,450 and 3,658,520, the disclosures of which are incorporated herein by reference.

A more preferred class of aromatic tertiary amines are those which include at least two aromatic tertiary amine moieties as described in U.S. Pat. Nos. 4,720,432 and 5,061,569. Such compounds include those represented by structural Formula A.

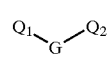

A wherein:

$Q_1$ and $Q_2$ are independently selected aromatic tertiary amine moieties; and G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B.

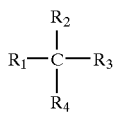

B where:

R$_1$ and R$_2$ each independently represent a hydrogen atom, an aryl group, or an alkyl group or R$_1$ and R$_2$ together represent the atoms completing a cycloalkyl group; and R$_3$ and R$_4$ each independently represent an aryl group, which is in turn substituted with a diaryl substituted amino group, as indicated by structural Formula C.

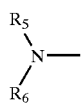

C wherein R$_5$ and R$_6$ are independently selected aryl groups. In one embodiment, at least one of R$_5$ or R$_6$ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D.

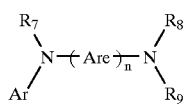

D wherein:

each Are is an independently selected arylene group, such as a phenylene or anthracene moiety, n is an integer of from 1 to 4; and Ar, R$_7$, R$_8$, and R$_9$ are independently selected aryl groups.

In a typical embodiment, at least one of Ar, R$_7$, R$_8$, and R$_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N'-Tetraphenyl-4,4'-diaminobiphenyl
N-Phenylcarbazole
Poly(N-vinylcarbazole)
N,N'-di-1-naphthalenyl-N,N'-diphenyl-4,4'-diaminobiphenyl
4,4'-Bis[N-(1-naphthyl)-N-phenylamino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4'-diamino-p-terphenyl
4,4'-Bis {N-phenyl-N-[4-(1-naphthyl)-phenyl]amino}biphenyl
4,4'-Bis[N-phenyl-N-2-pyrenyl)amino]biphenyl
2,6-Bis[N,N-di(2-naphthyl)amine]fluorene
1,5-Bis[N-1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Material

Light-emitting materials useful as organic material 70 are well known. As more fully described in U.S. Pat. Nos. 4,769,292 and 5,935,721, the light-emitting layer (LEL) of the organic EL element comprises a luminescent or fluorescent material where electroluminescence is produced as a result of electron-hole pair recombination in this region. The light-emitting layer can be comprised of a single material, but more commonly includes two or more components, e.g. a host material doped with a guest compound, or compounds where light emission comes primarily from the dopant and can be of any color. The host materials in the light-emitting layer can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00118851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

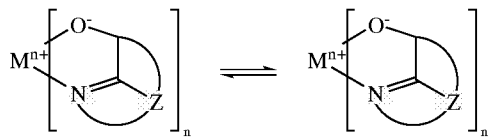

E wherein:

M represents a metal;

n is an integer of from 1 to 3; and

Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally, any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function, the number of ring atoms is usually maintained at 18 or less.

Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo {f}-8-quinolinolato]zinc (II)

CO-4: Bis(2-methyl-8-quinolinolato)aluminum(III)-µ-oxo-bis(2-methyl-8-quinolinolato)aluminum(III)

CO-5: Indium trisoxine [alias, tris(8-quinolinolato) indium]

CO-6: Aluminum tris(5-methyloxine) [alias, tris(5-methyl-8-quinolinolato) aluminum(III)]

CO-7: Lithium oxine [alias, (8-quinolinolato)lithium(1)]

CO-8: Gallium oxine [alias, tris(8-quinolinolato)gallium (II)]

CO-9: Zirconium oxine [alias, tetra(8-quinolinolato) zirconium(IV)]

Derivatives of 9,10-di-2-naphthyl)anthracene (Formula F) constitute one class of useful hosts capable of supporting electroluminescence, and are particularly suitable for light emission of wavelengths longer than 400 nm, e.g., blue, green, yellow, orange or red.

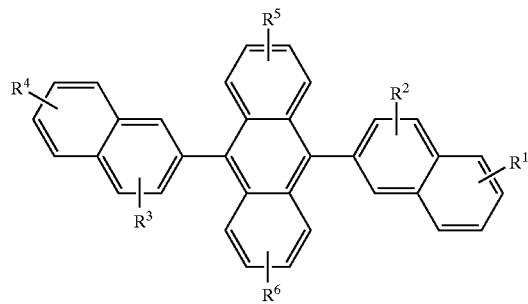

F wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Benzazole derivatives (Formula G) constitute another class of useful hosts capable of supporting electroluminescence, and are particularly suitable for light emission of wavelengths longer than 400 nm, e.g., blue, green, yellow, orange or red.

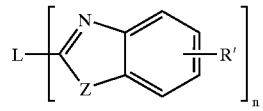

G wherein:

n is an integer of 3 to 8;

Z is O, NR or S;

R' is hydrogen; alkyl of from 1 to 24 carbon atoms, for example, propyl, t-butyl, heptyl, and the like; aryl or hetero-atom substituted aryl of from 5 to 20 carbon atoms, for example, phenyl and naphthyl, furyl, thienyl, pyridyl, quinolinyl and other heterocyclic systems; or halo such as chloro, fluoro; or atoms necessary to complete a fused aromatic ring; and L is a linkage unit including alkyl, aryl, substituted alkyl, or substituted aryl, which conjugately or unconjugately connects the multiple benzazoles together.

An example of a useful benzazole is 2,2',2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

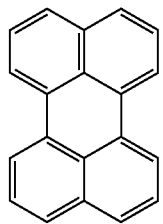
L1
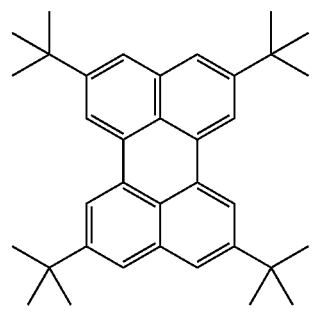
L2
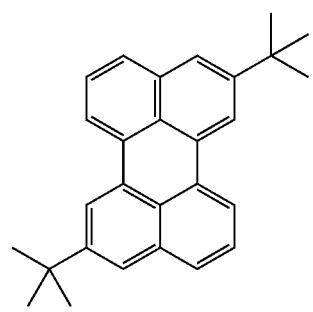
L3
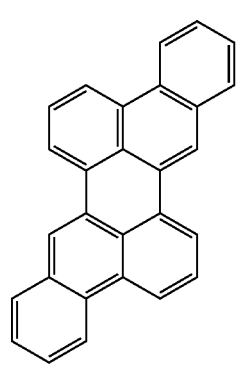
L4
-continued
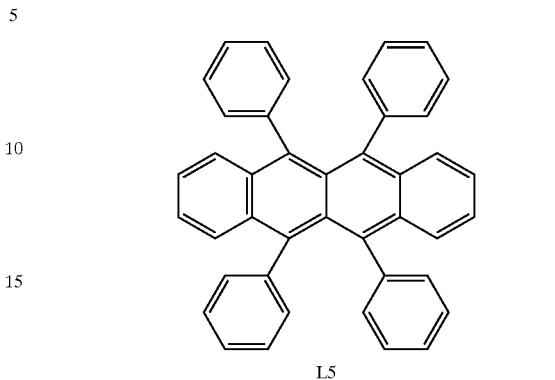
L5
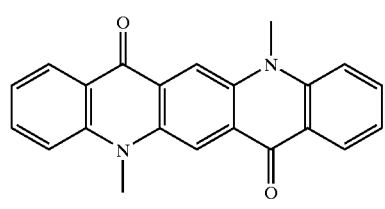
L6
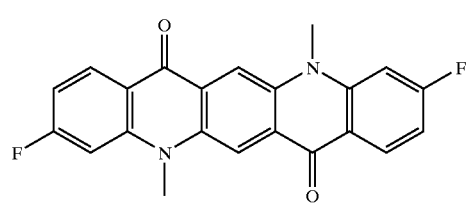
L7
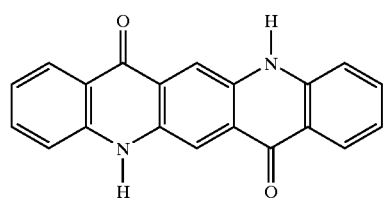
L8

-continued

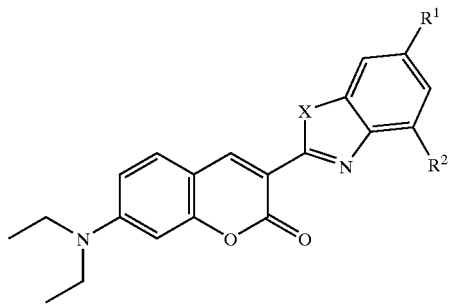

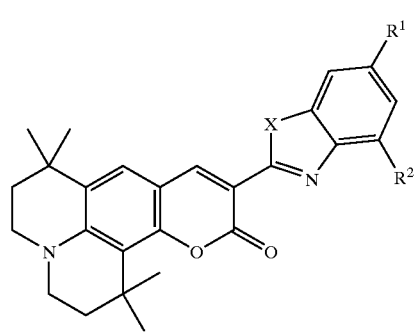

|  | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

-continued

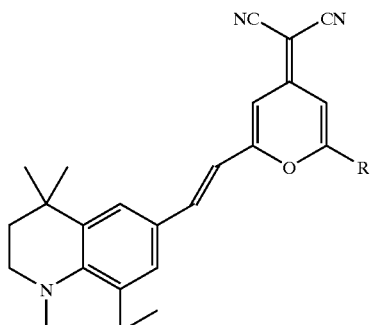

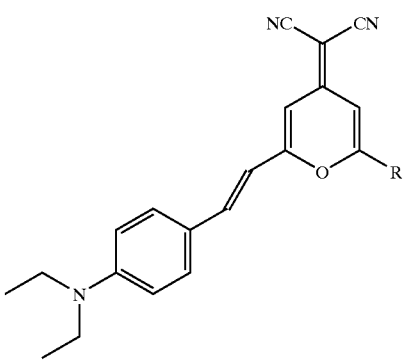

|  | R |
|---|---|
| L37 | phenyl |
| L38 | methyl |
| L39 | t-butyl |
| L40 | mesityl |
| L41 | phenyl |
| L42 | methyl |
| L43 | t-butyl |
| L44 | mesityl |

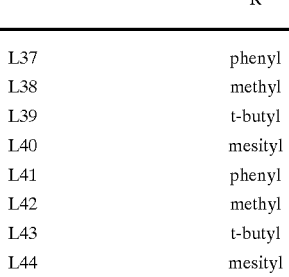

L45

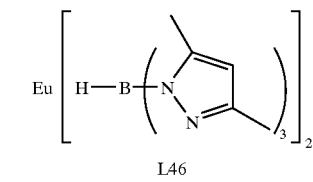

L46

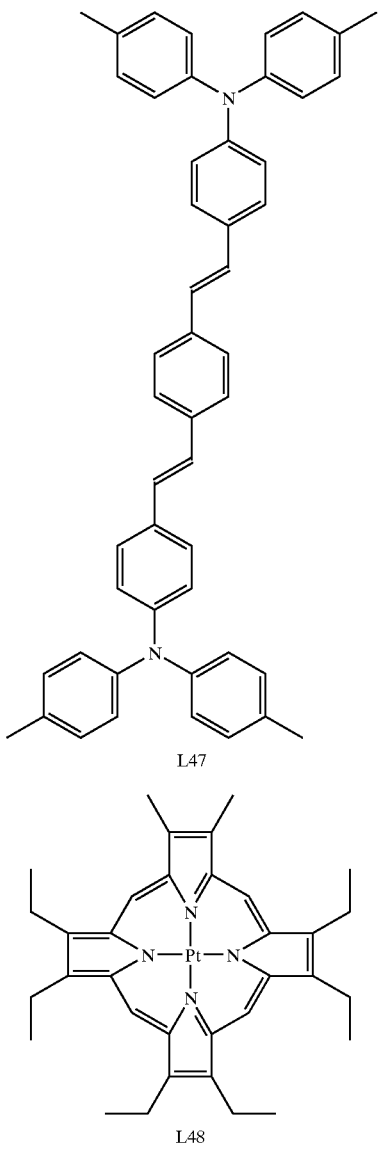

L47

L48

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein.

Electron-Transporting (ET) Material

Preferred electron-transporting materials for use in organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Organic Conductive Molecules and Polymers*, Vols. 1–4, H. S. Nalwa, ed., John Wiley and Sons, Chichester (1997).

In some instances, a single layer can serve the function of supporting both light emission and electron transportation, and will therefore include emissive material and electron-transporting material.

Figure 2:
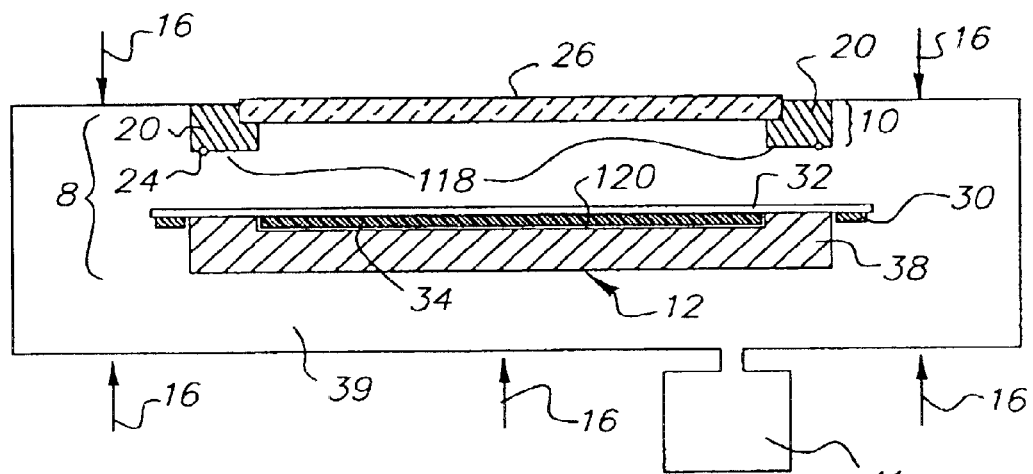
FIG. 2 is a cross-sectional representation of one embodiment of an apparatus designed in accordance with this invention and enclosed in a vacuum chamber.

Turning now to FIG. 2, there is shown a cross-sectional representation of one embodiment of an apparatus 8 designed in accordance with this invention and permitting the transfer of organic material from a donor onto a substrate. A first fixture 10 is arranged in such a way as to form part of a chamber and to support donor 32 and substrate 34 in a relationship relative to one another whereby there will be either a uniform separation between portions of substrate 34 and the donor 32, or substrate 34 and donor 32 will be in contact, and wherein organic material will be transferred onto portions of substrate 34. Base 20 is a part of first fixture 10 and also a part of vacuum chamber 39. Contact surface 118 of base 20 and substrate support surface 120 of pressure plate 38 provide the structure necessary for maintaining the position of laser light-absorbing layer 74 of donor 32 after it is clamped by pressure plate 38 to first fixture 10. An airtight seal is defined herein as having no fluid leaks or having a sufficiently low leak rate as to not adversely affect the environmental conditions within the vacuum chamber. Although not shown here, additional materials such as gaskets, o-rings, clamps, and fasteners can be used as needed to form an airtight seal. O-ring 24 mounted on base 20 of first fixture 10 is fully compressed (typically to 80% of its free diameter) during clamping and creates an airtight seal. O-ring 24 is typically made of viton, but seals made from stainless steel, aluminum or other material appropriate to a high vacuum environment can also be used. First fixture 10 includes transparent portion 26, which is fitted into base 20. Transparent portion 26 can be in the form of a plate as depicted here or other convenient shape, and forms an airtight seal with base 20. Transparent portion 26 is located in such a way that it is over non-transfer surface 33 of donor 32.

Transparent portion 26 is a material transparent to the impinging radiation so as to permit transmission of a laser light beam and structurally sufficient to withstand a pressure difference of at least 1 atmosphere between opposing sides. One example is an optical BK-7 glass made by Schott Glass Technologies, Inc., which is prepared to be optically clear to laser light. The thickness of transparent portion 26 is determined by its material properties, the pressure difference, and the overall exposed area.

A second fixture 12 includes pressure plate 38, which is aligned with and engages first fixture 10 in a manner that will become apparent, and which is movable to clamp donor 32 and compress o-ring 24 to create an airtight chamber between non-transfer surface 33 of donor 32 and transparent portion 26. Substrate 34 is captured between donor 32 and pressure plate 38 during this clamping process. Pressure plate 38 thereby clamps donor 32 and substrate 34 to first fixture 10. Pressure plate 38 is made of a rigid material, such as steel, aluminum or rigid plastic, and must be flat to within 10 microns during the organic material transfer process.

The open relationship of the first and second fixtures in FIG. 2 facilitates transfer of donor 32 and substrate 34 into and out of apparatus 8. In this embodiment, substrate 34 is placed between the fixtures in such a way that it will be supported by second fixture 12. Donor 32 is placed over the substrate 34. Since donor 32 can be formed from a flexible support, rigid frame 30 can optionally be used as a support for the loading and unloading of sheets of donor 32.

Substrate 34 can be an organic solid, an inorganic solid, or a combination of organic and inorganic solids that provides a surface for receiving organic material from a donor. Substrate 34 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 34 can be a homogeneous mixture of materials, a composite of materials, or multiple layers of materials. Substrate 34 can be an OLED substrate, that is a substrate commonly used for preparing OLED devices, e.g. active-matrix low-temperature polysilicon TFT substrate. Substrate 34 can either be light-transmissive or opaque, depending on the intended direction of light emission. The light-transmissive property is desirable for viewing the EL emission through the substrate. Transparent glass or plastic are commonly employed in such cases. For applications where the EL emission is viewed through the top electrode, the transmissive characteristic of substrate 34 is immaterial, and therefore can be light-transmissive, light-absorbing or light reflective. Substrates for use in this case include, but are not limited to, glass, plastic, semiconductor materials, ceramics, and circuit board materials, or any others commonly used in the formation of OLED devices, which can be either passive-matrix devices or active-matrix devices.

Apparatus 8 can be provided in vacuum chamber 39, which is kept under vacuum by vacuum pump 41. This is advantageous for certain types of transfer for several reasons: 1) the transfer across a non-contact gap is more effective under vacuum, and 2) some donor materials are sensitive to oxygen, moisture, or other contaminants. Arrows 16 represent forces applied to vacuum chamber 39 due to differential pressure between the exterior and interior of vacuum chamber 39. Such forces can potentially cause flexing of the chamber walls and can change the position of base 20 against which donor 32 will rest in the closed position.

It shall be understood that first fixture 10 can be arranged to be in a position to perform some or all of the functions of second fixture 12, and second fixture 12 can perform some or all of the functions of first fixture 10.

Figure 3A:
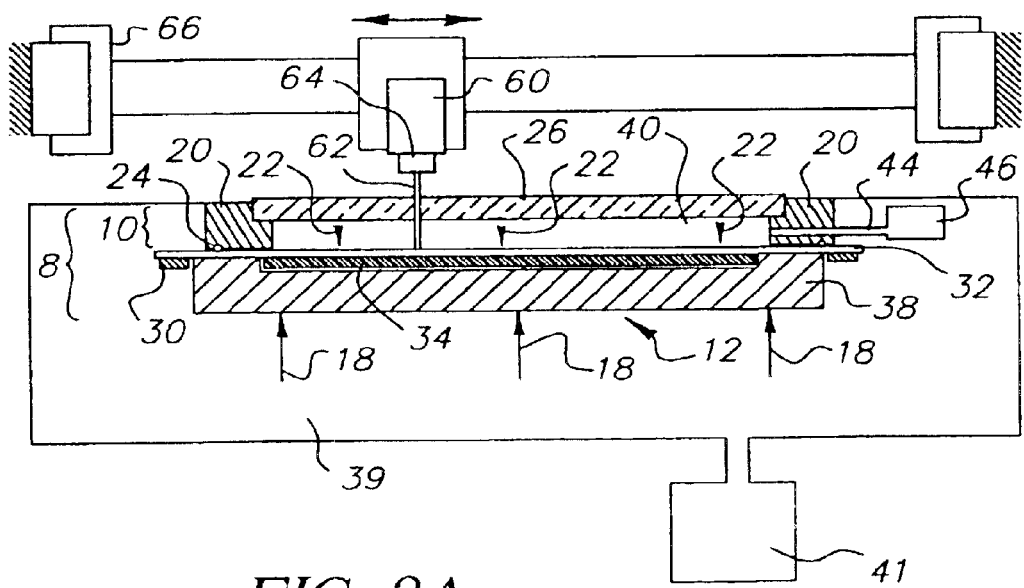
FIG. 3A is a cross-sectional representation of the aforementioned apparatus in closed configuration with a movable laser.
Figure 3B:
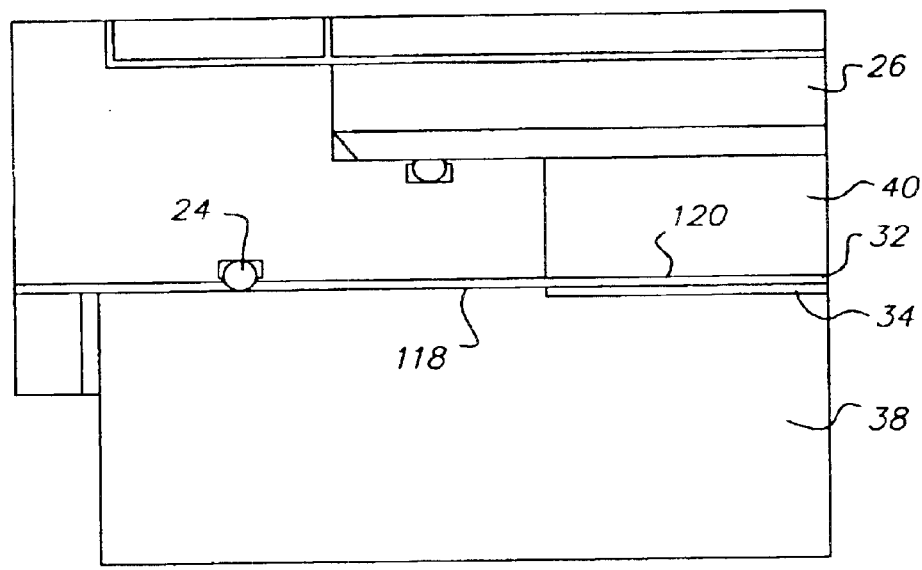
FIG. 3B is a detail of FIG. 3A.

FIG. 3A shows the aforementioned apparatus 8 in a closed configuration with a movable laser capable of moving in a plane parallel to the surface of substrate 34. First fixture 10 and second fixture 12 are aligned with each other so that they engage, and pressure plate 38 is clamped to first fixture 10 with donor 32 captured in-between, forming chamber 40 over non-transfer surface 33 of donor 32. Pressure plate 38 fully compresses o-ring 24 in base 20 (shown in detail in FIG. 3B) onto and around the perimeter of donor 32, which creates an airtight seal around chamber 40, while positioning laser light-absorbing layer 74 of donor 32 within the focal plane of laser 60 and positioning substrate 34 into the proper relationship with donor 32. Together with the airtight seal formed by base 20 and transparent portion 26, chamber 40 is formed to permit pressure to be provided against non-transfer surface 33 of donor 32. Arrows 18 show the clamping force applied to pressure plate 38 to cause it to clamp against first fixture 10, which can cause flexing of pressure plate 38, which can cause portions of laser light-absorbing layer 74 of donor 32 to fall outside of the focal plane of laser light beam 62. The clamping force can also cause flexing of base 20, which if it is not sufficiently rigid can cause misplacement of pressure plate 38 such that portions of laser light-absorbing layer 74 fall outside of the focal plane of laser light beam 62.

Fluid supply 46 and fluid passage 44 provide a structure for supplying a fluid to chamber 40 to apply pressure to non-transfer surface 33 of donor 32 so that there will either be a controlled separation between portions of donor 32 and substrate 34, or substrate 34 and donor 32 will be in contact. Arrows 22 represent the pressure that the fluid will exert against donor 32, and therefore substrate 34 and pressure plate 38. This pressure can potentially cause flexing or movement of pressure plate 38 and donor 32, which can cause portions of laser light-absorbing layer 74 to fall outside of the focal plane of laser light beam 62. The fluid for pressurizing chamber 40 can be a gas (e.g. air, nitrogen, argon, helium), a liquid (e.g. water or a liquid fluorocarbon), a gas that liquefies under pressure (e.g. Freon), or a super-critical fluid (e.g. carbon dioxide). A gas is the preferred fluid. Nitrogen or argon are the most preferred fluids. Movable laser 60 produces a beam of light, e.g. laser light bean 62. Laser 60 includes at least one lens 64 for focusing laser light beam 62 at a position corresponding to laser light-absorbing layer 74 of donor 32. Laser 60 can be a multichannel linear array laser as described by Kay et al. in U.S. Pat. No. 6,582,875 for use in preparing OLED devices. Laser moving mechanism 66 can position laser 60 above any point of substrate 34 to permit transmission of the laser light beam 62 through the appropriate portion of transparent portion 26 to the appropriate part of non-transfer surface 33 of donor 32. Laser moving mechanism 66 can be microposition equipment as described by Kay. Laser 60 is positioned so that the laser light is focused on laser light-absorbing layer 74 as laser light beam 62 moves across donor 32 when pressure plate 38 is fully clamped against base 20.

To ensure that laser light-absorbing layer 74 is properly positioned relative to the focal plane of laser 60 during the organic material transfer process, it is necessary to properly design pressure plate 38 and base 20 to avoid excess flexing under the primary load conditions during the organic material transfer process. These load conditions are: 1) 1 atmosphere pressure differential across the walls of chamber 40; 2) pressure plate 38 fully clamped against base 20 of first fixture 10 and fully compressing o-ring 24; and 3) chamber 40 under full pressure (typically 5 psia or less). Several enhancements to commonly assigned U.S. patent application Ser. No. 10/021,410 filed Dec. 12, 2001, entitled "Apparatus for Permitting Transfer of Organic Material From a Donor to Form a Layer in an OLED Device" by Bradley A. Phillips et al., the disclosure of which is rated herein by reference, have been made to address this.

Figure 4A:
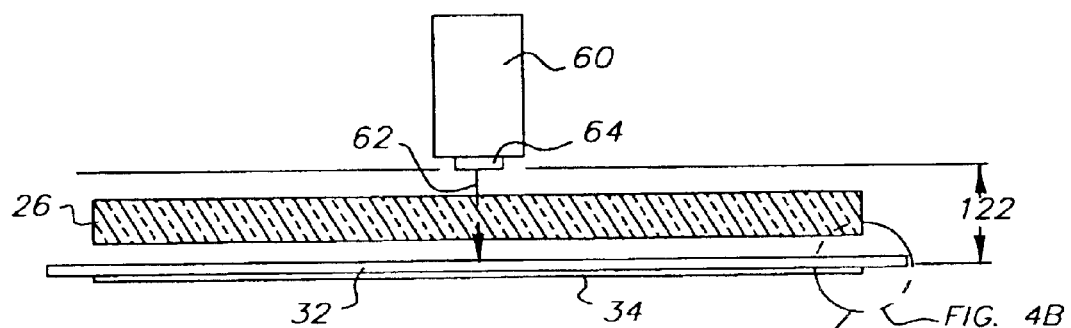
FIGS. 4A and 4B are cross-sectional representations showing the spatial relationship between a donor and a laser.
Figure 4B:
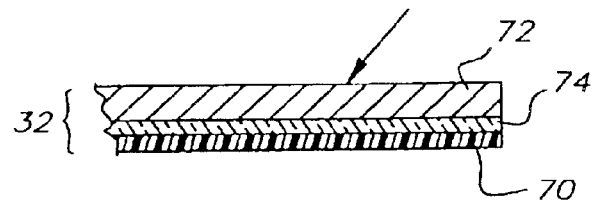

In order to effect material transfer of an organic material from a donor 32 to a substrate 34 using laser light beam 62, the donor 32 must be maintained in a defined spatial relationship to the laser 60 as shown in FIGS. 4A and 4B. In particular, the spatial relationship between laser light-absorbing layer 74 and laser translation plane 114 is defined by laser focal length 122. Typically this distance has a tolerance of ±35 microns from nominal.

Figure 5:
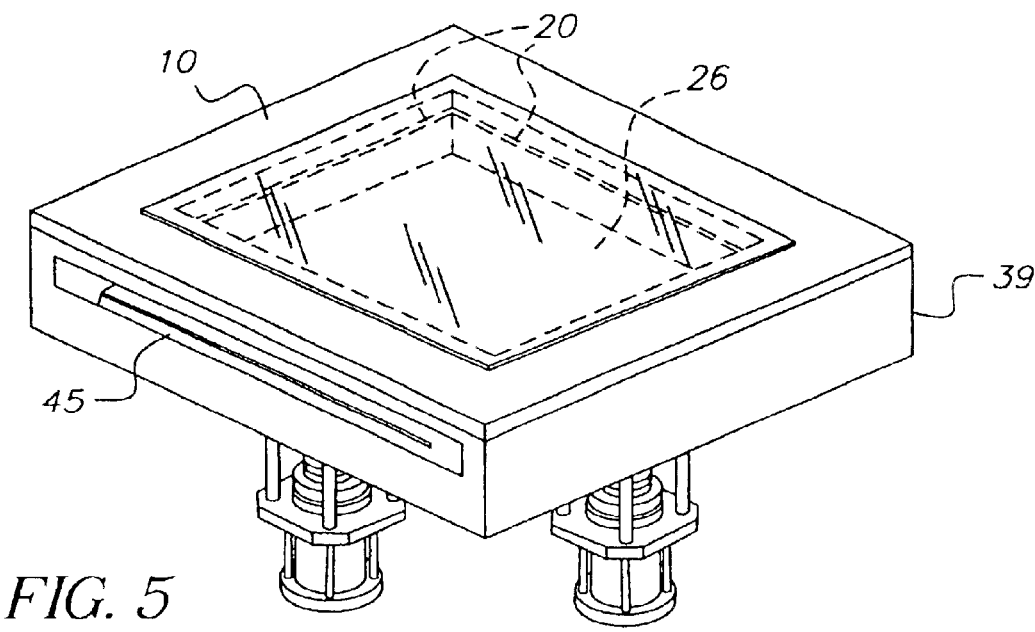
FIG. 5 is a three-dimensional representation of a typical design of an apparatus that can be used in this invention.

FIG. 5 shows a three-dimensional representation of a typical design of apparatus 8. The walls of vacuum chamber 39 are 50 mm thick, and the outside dimensions are 900× 1020×240 mm. Base 20 forms the top of vacuum chamber 39 and is also 50 mm thick with an opening for mounting transparent portion 26. Transparent portion 26 fits into the top of vacuum chamber 39, which, together with base 20 forms first fixture 10. Entrance 45 is used for loading and unloading substrates 34 and donors 32 to and from vacuum chamber 39. Entrance 45 can be closed with a gate valve (not shown) during use and is typically attached to an adjacent vacuum chamber.

Figure 6:
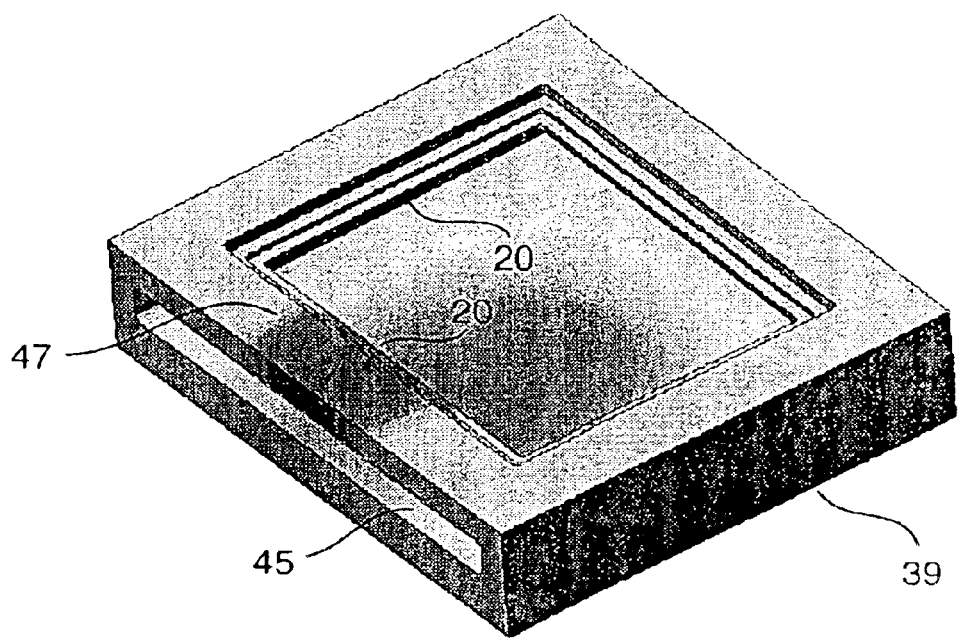
FIG. 6 is a three-dimensional representation of a vacuum chamber in which finite element analysis reveals excessive flexing (visually exaggerated)

FIG. 6 shows a three-dimensional representation of the results of a three-dimensional structural deformation analysis of vacuum chamber 39. The analysis reveals excessive flexing under the load conditions described above where the total force of pressure plate 38 against base 20 was approximately 4000 pounds and the tooling material is stainless steel. In this particular case, finite element analysis software was employed to perform the analysis although any structural analysis technique can be used. The analysis showed that under operational load conditions, base 20 at entrance top 47 will flex by more than 87 microns in the negative 'y' direction. This was more than the allowable ±10 micron tolerance and will cause excessive deviation of the position of laser light-absorbing layer 74.

Figure 7:
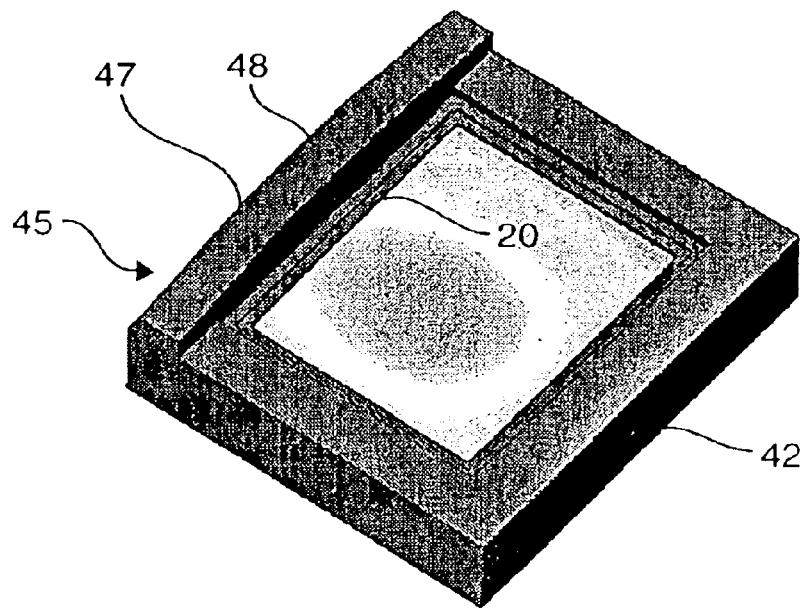
FIG. 7 is a three-dimensional representation of a vacuum chamber designed in accordance with this invention in which a stiffening rib reduces flexing.

Turning now to FIG. 7, there is shown a three-dimensional representation of a vacuum chamber designed in accordance with this invention in which a stiffening rib reduces undesired flexing. Vacuum chamber 42 includes a stiffening rib 48 above entrance 45. The results of an analysis showed that the addition of stiffening rib 48 at entrance top 47 reduces the flex of base 20 to less than ±6 microns. Stiffening rib 48 is therefore one way of maintaining the spacing of laser 60 relative to donor 32 so that laser light-absorbing layer 74 is within the focal plane of laser light beam to within ±35 microns.

Figure 8:
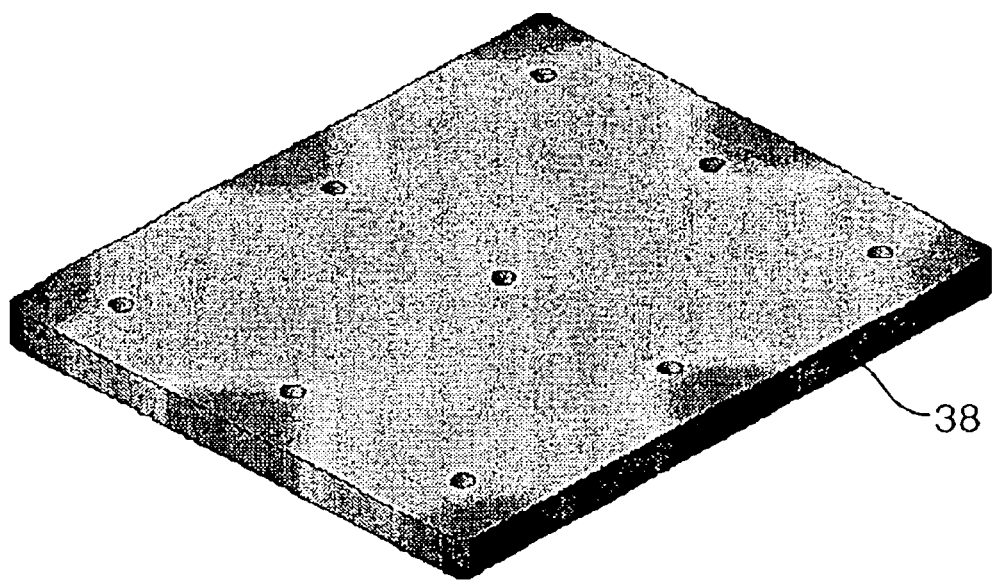
FIG. 8 is a three-dimensional representation of the flexing of a pressure plate as determined by finite element analysis (visually exaggerated)

FIG. 8 shows the results of a similar three-dimensional structural deformation analysis on a pressure plate as determined by finite element analysis software for the same load conditions described above. As described above, pressure plate 38 serves as a way of maintaining the position of donor 32 after it was clamped to first fixture 10, so that the laser light-absorbing layer 74 of donor 32 is maintained within the focal plane of laser light beam 62 as laser 60 and laser light beam 62 move across donor 32 when actuated by laser moving mechanism 66. Pressure plate 38, in this analysis, was 50 mm thick stainless steel and the clamping force was applied at the midpoint along each edge. The analysis showed that the deflection of pressure plate 38 was less than 9 microns, which was below the 10 micron tolerance limit.

Figure 9:
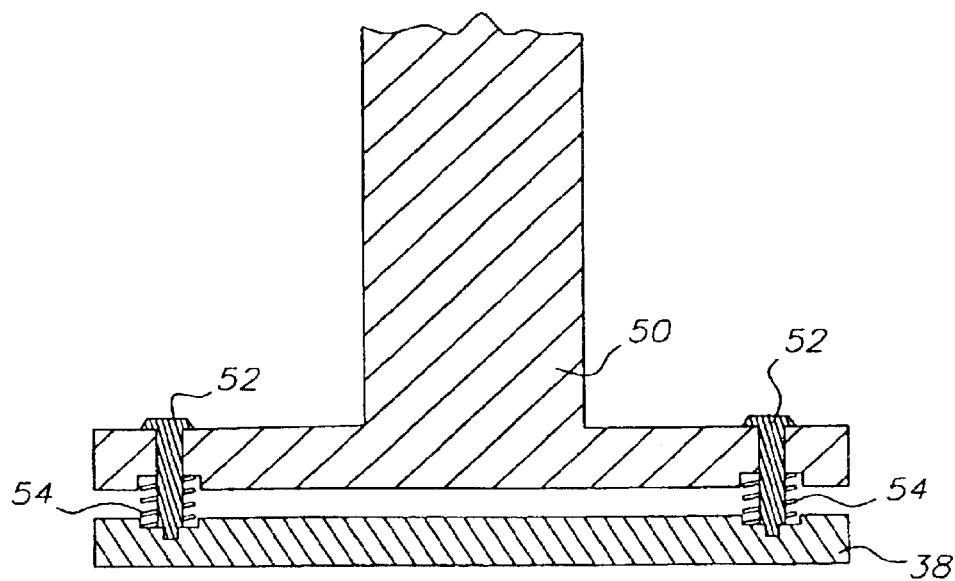
FIG. 9 is a cross-sectional representation of a mounting structure for a pressure plate to apply uniform pressure in accordance with this invention.

Turning now to FIG. 9, there is shown a cross-sectional view of a structure which mounts the pressure plate for applying uniform pressure to the o-ring around the perimeter of the donor by a spring loaded pressure plate. Actuator 50 is attached to pressure plate 38 by retention posts 52, which can be screws, rivets, bolts or other fastening arrangements. Springs 54 maintain a distance between actuator 50 and pressure plate 38 and are typically preloaded to an appropriate force level. Retention posts 52 and springs 54 serve as a way of mounting pressure plate 38 and permit pressure plate 38 to apply uniform pressure to o-ring 24 around the perimeter of donor 32 even if actuator 50 is misaligned. Springs 54 must be sized to apply enough force to fully compress o-ring 24 around it's entire length before actuator 50 bottoms-out. This ensures that even pressure is maintained and that no leaks will occur around the seal formed by o-ring 24. For a typical application, the force needed from pressure plate 38 can be 4000 pounds. Assuming the use of four (4) springs, a spring free-length of 2.00 inches, and a spring compression of 20%, the springs would be sized with a spring rate of approximately 2500 pounds per inch.

Figure 10:
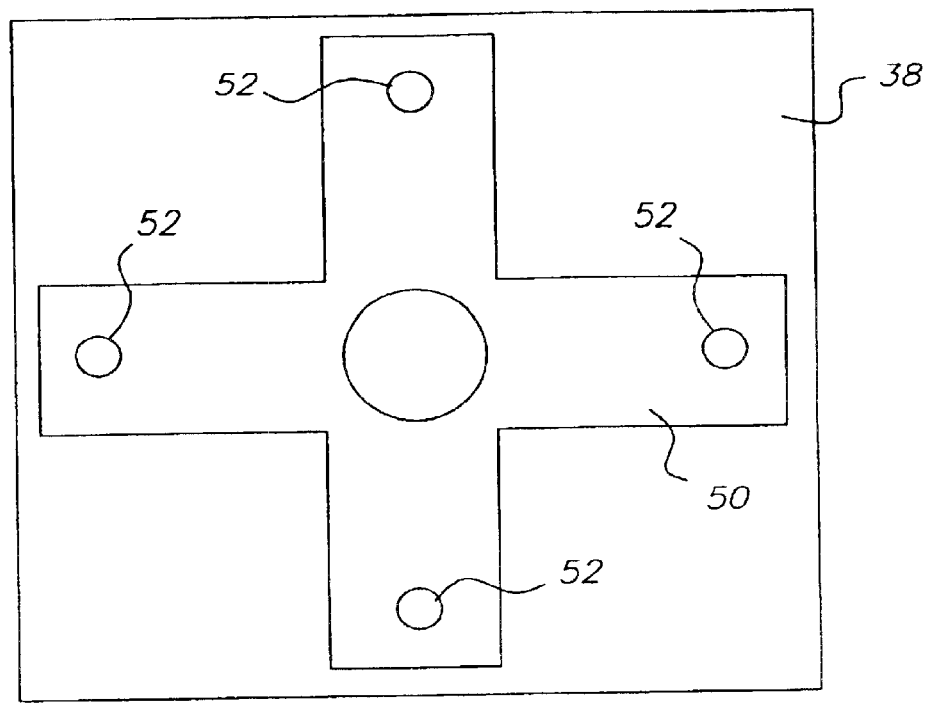
FIG. 10 is a top view of the mounting structure of FIG. 9 for mounting a pressure plate.

Turning now to FIG. 10, there is shown a top view of the above structure for mounting the pressure plate to apply uniform pressure to the o-ring around the perimeter of the donor by a spring loaded pressure plate.

Figure 11:
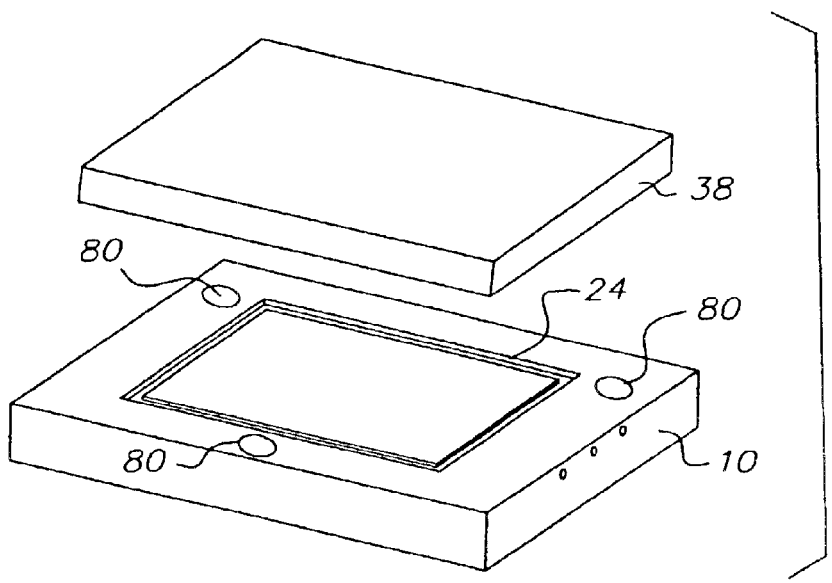
FIG. 11 is a three-dimensional representation of a way of controlling the engagement of the pressure plate and the first fixture.

Turning now to FIG. 11, there is shown a three-dimensional representation for a way of controlling the engagement of the pressure plate and the first fixture. First fixture 10 includes stop buttons 80 that protrude a set height above the surface of first fixture 10. The height can be controlled by e.g. machining of buttons 80, the use of shims, the use of precision adjustment screws, or other adjustment arrangements. Stop buttons 80 provide adjustable precision positioning of clamped pressure plate 38 and thereby a precision adjustment of the position of laser light-absorbing layer 74 during the organic material transfer process. Stop buttons 80 must be adjusted such that pressure plate 38 compresses o-ring 24 enough to create and airtight seal.

Figure 12:
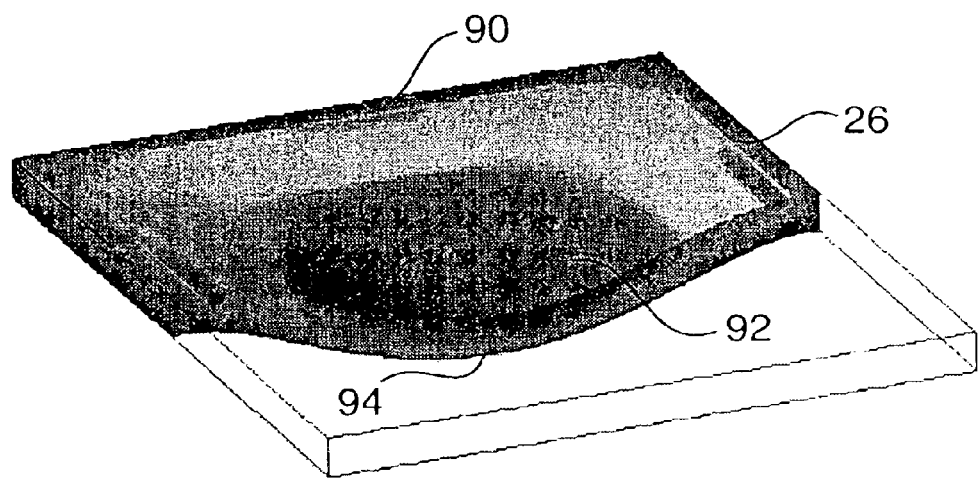
FIG. 12 is a three-dimensional representation of the stress load on the transparent portion during the organic transfer process as determined by finite element analysis.

It is important that transparent portion 26 be designed to withstand the tensile loads induced by the pressure differential across it's thickness (typically about 1 atmosphere) such that failure leading to breakage does not occur. Typically tensile loads for this application should be kept below 1000 psi for optical glass such as BK7. Tensile stress reduction can primarily be accomplished by increasing the glass thickness for given window size, material properties, surface conditions and boundary (mounting) conditions. Turning now to FIG. 12, there is shown a three-dimensional representation of the stress on transparent portion 26 assuming certain part dimensions, material properties for BK7 optical glass, boundary (mounting) conditions, and a 1 atmosphere differential. This analysis was done using finite element analysis software but can also be done using simple stress formulas. In this case, tensile stress is shown to be particularly concentrated at midpoints along the top edges as shown at edge 90 and on bottom center 94 of transparent portion 26 but is below the 1000 psi design criteria. Compression is particularly concentrated on center top 92.

Figure 13:
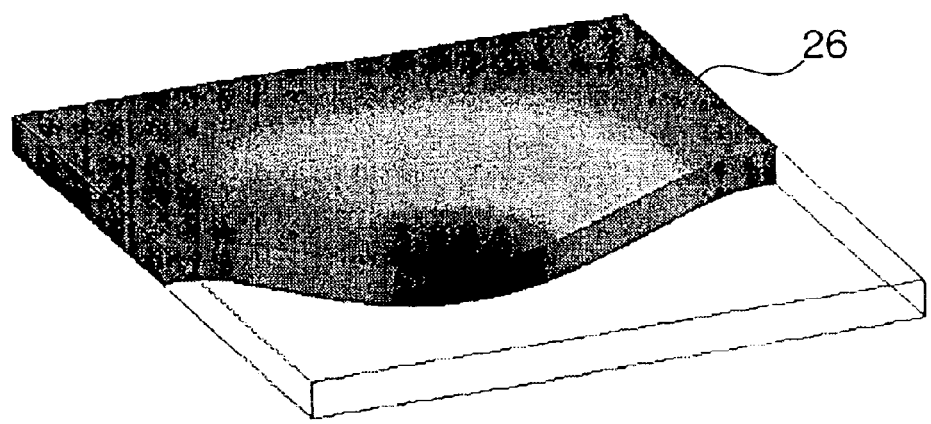
FIG. 13 is a three-dimensional representation of the flexing of a transparent portion as determined by finite element analysis (visually exaggerated)

It is also important to minimize the amount of flex induced on transparent portion 26 by the aforementioned pressure differential as to minimize offset refraction of laser light beam 62 as it passes through transparent portion 26, as such offset refraction can cause mislocation of laser light beam 62 on donor 32. Turning now to FIG. 13, there is shown a three-dimensional representation of the deformation of a transparent portion due to the above-determined stress as determined by finite element analysis software. Transparent portion 26 has a determinable downward bowing. This deformation can be reduced by increasing the thickness of transparent portion 26 as described above for tensile stress reduction.

Figure 14A:
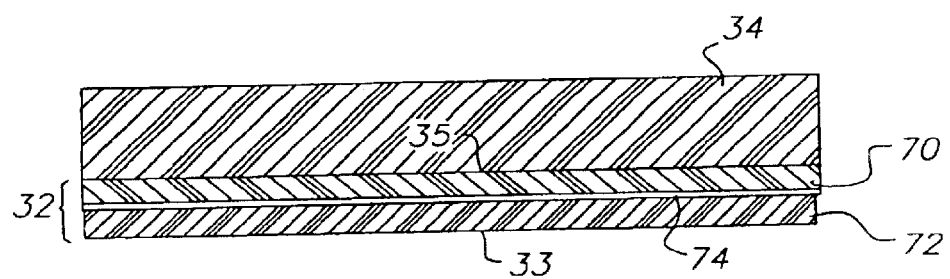
FIG. 14A is a cross-sectional view of one embodiment of the placement of a donor against a substrate.

FIG. 14A shows a cross-section view of one embodiment of the placement of donor 32 against substrate 34 in accordance with this invention. In this embodiment, transfer surface 35 of donor 32 and substrate 34 are held in full contact by the pressure that is exerted by the pressurizing fluid against non-transfer surface 33 and the pressure exerted by pressure plate 38 against substrate 34. Such a positioning permits organic material transfer by e.g. melt transfer.

Figure 14B:
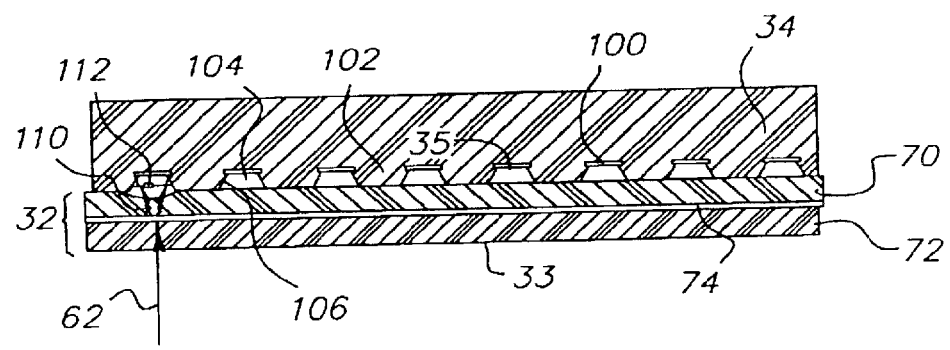
FIG. 14B is a cross-sectional view of another embodiment of the placement of donor against a substrate.

FIG. 14B shows a cross-section view of another embodiment of the placement of donor 32 against substrate 34 in accordance with this invention. In this embodiment, receiving surface 106 of substrate 34 is uneven due to the presence of thin-film transistors 100. Thin-film transistors 100 are separated in substrate 34 by raised surface portions 102 as a result of the multilayer construction of each pixel or sub-pixel. This is described by Tang in commonly assigned U.S. Pat. No. 5,937,272, the disclosure of which is incorporated herein by reference. The presence of raised surface portions 102 maintains the separation of gap 104 against the pressure that is exerted by the pressurizing fluid against non-transfer surface 33 and maintains a separation between portions of donor 32 and substrate 34.

FIG. 14B also shows the transfer of organic material 70 from donor 32 to portions of substrate 34 by treatment with light. A pattern of laser light beam 62 irradiates non-transfer surface 33. Heat 110 is produced when laser light beam 62 strikes laser light-absorbing layer 74, permitting heat 110 to be absorbed by organic material 70 in the immediate vicinity of laser light beam 62, which causes the transfer of organic material 70 to substrate 34. A large portion of the light impinging on donor 32 will be converted to heat, but this will only happen at selectively irradiated portions of donor 32. Some or all of the heated portion of organic material 70 undergoes organic material transfer, that is, it is sublimed, vaporized, or ablated and becomes transferred organic material 112 on receiving surface 106 of substrate 34 in a patterned transfer.

The invention has been described in detail with particular reference to certain preferred embodiments thereof, but it will be understood that variations and modifications can be effected within the spirit and scope of the invention.

Parts List 8 apparatus
10 first fixture
12 second fixture
16 arrow
18 arrow
20 base
22 arrow
24 o-ring
26 transparent portion
30 rigid frame
32 donor
33 non-transfer surface
34 substrate
35 transfer surface
38 pressure plate
39 vacuum chamber
40 chamber
41 vacuum pump
42 vacuum chamber
44 fluid passage
45 entrance
46 fluid supply
47 entrance top
48 stiffening rib
50 actuator
52 retention posts
54 spring PARTS LIST (con't)

60 laser
62 laser light beam
64 lens
66 laser moving mechanism
70 organic material
72 support
74 laser light-absorbing layer
80 stop button
90 edge
92 center top
94 center bottom
100 thin-film transistor
102 raised surface portions
104 gap
106 receiving surface
110 heat
112 transferred organic material
114 laser translation plane
118 contact surface
120 substrate support surface
122 laser focal length

What is claimed is:

1. Apparatus for permitting the transfer of organic material from a donor onto a substrate to form a layer of organic material on one or more OLED devices, wherein the donor includes a laser light-absorbing layer, and a layer with heat transferable organic material, comprising:

a) means for providing a movable laser for producing a beam of light and at least one lens for focusing such light beam at a position corresponding to the laser light-absorbing layer in the donor;

b) a first fixture arranged to support the donor and substrate in a relationship relative to one another whereby there will be either a separation between portions of the substrate and the donor, or the substrate and donor will be in contact, and wherein organic material will be transferred onto portions of the substrate;

c) a second fixture including a pressure plate aligned with and engaging the first fixture, the donor being supported on the pressure plate and the pressure plate being movable to clamp the donor and substrate to the first fixture and forming a chamber relative to a non-transfer surface of the donor;

d) means for supplying a fluid to the chamber to apply pressure to the non-transfer surface of the donor so as to ensure the position of the donor relative to the substrate;

e) the first fixture including a transparent portion located in relationship to the non-transfer surface of the donor to permit transmission of the laser light beam through such transparent portion to the non-transfer surface of the donor; and f) means for maintaining the spacing of the laser relative to the donor so that the laser light-absorbing layer is within the focal plane of the laser light beam to within ±35 microns, the laser being positioned so that the laser light is focused on the laser light-absorbing layer as the laser light beam moves across the donor to permit heat to be absorbed which causes the transfer of organic material to the substrate.

2. The apparatus of claim 1 wherein the fluid is a gas or liquid.

3. The apparatus of claim 1 wherein the laser light-absorbing layer includes radiation-absorbing material capable of absorbing radiation in a predetermined portion of the spectrum for producing heat which will cause the transfer of organic material.

4. The apparatus of claim 3 wherein the radiation-absorbing material is in the form of a patterned layer selected to cause a patterned transfer of organic material.

5. The apparatus of claim 3 further including a vacuum chamber and wherein the apparatus is provided in such vacuum chamber.

6. The apparatus of claim 3 wherein the donor is formed in a sheet.

7. The apparatus of claim 1 further including means for maintaining the position of the donor after it is clamped by the pressure plate to the first fixture.

8. The apparatus of claim 7 wherein the maintaining means includes an o-ring mounted on the first fixture which is compressed when the pressure plate is clamped to the first fixture.

9. The apparatus of claim 8 wherein the maintaining means includes means for mounting the pressure plate to apply uniform pressure to the o-ring around the perimeter of the donor.

* * * * *